Figure 1:
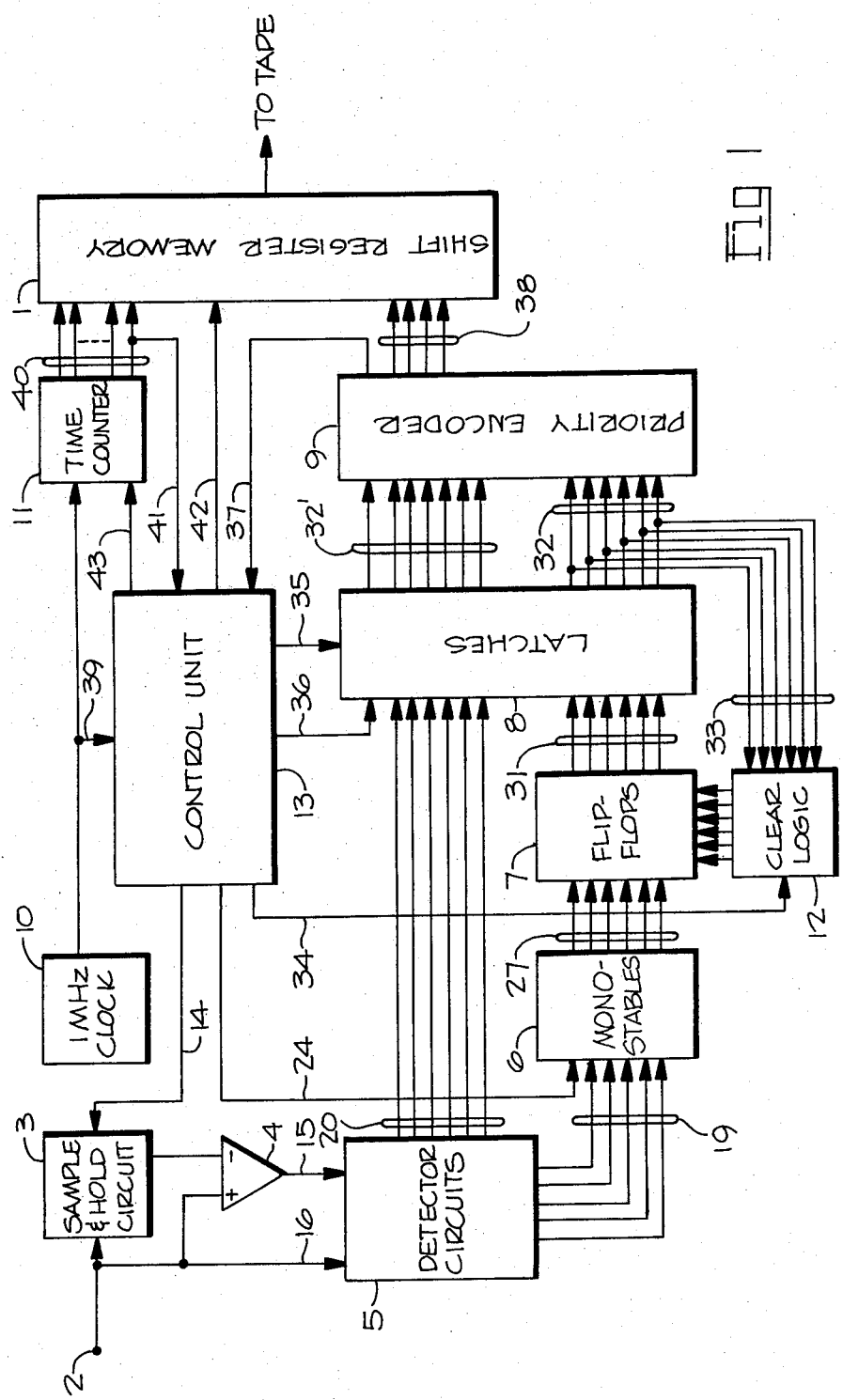

United States Patent [19]

Hinz et al.

[11] 4,291,299

[45] Sep. 22, 1981

[54] ANALOG TO DIGITAL CONVERTER USING TIMED LEVEL CHANGES

[75] Inventors: Lorne C. Hinz, Richmond; William P. Thomas, Ottawa, both of Canada

[73] Assignee: Northern Telecom Limited, Montreal, Canada

[21] Appl. No.: 89,937

[22] Filed: Oct. 31, 1979

[51] Int. Cl.³ ............................................. H03K 13/02
[52] U.S. Cl. ........................ 340/347 AD; 340/347 M; 358/138; 358/261; 364/112
[58] Field of Search .... 340/347 M, 347 SH, 347 AD; 328/114, 132, 151; 358/133, 138, 261; 364/112; 307/353; 375/25

[56] References Cited

U.S. PATENT DOCUMENTS

| | | | |
|---|---|---|---|
| 2,949,505 | 8/1960 | Kretzmer | 375/25 |
| 2,978,535 | 4/1961 | Brown | 358/261 |
| 3,383,461 | 5/1968 | Dryden | 358/138 |
| 3,753,133 | 8/1973 | Shumate | 340/347 AD X |

FOREIGN PATENT DOCUMENTS

2344816 10/1977 France .......................... 340/347 SH

*Primary Examiner*—Thomas J. Sloyan
*Attorney, Agent, or Firm*—Achmed N. Sadik

[57] ABSTRACT

An analog signal is sampled in response to a sampling command. Each time that the analog signal, or the difference between the analog signal and the previous sample thereof, crosses a respective reference level, a digital signal is produced. Each digital signal consists of a code representing the level crossing or incremental change in level which has occurred and a count representing the time which has elapsed since the last sample command. A digital signal is also produced if the elapsed time reaches a predetermined period. On production of each digital signal, a sampling command is produced and the elapsed time counting is recommenced. The digital signals constitute a digital representation of the analog signal. The converter is particularly useful for converting analog signals having both very high and very low frequency portions, such as current surges which occur on telephone lines affected by lightning (high frequency) and 60 Hz induction (low frequency).

14 Claims, 5 Drawing Figures

ANALOG TO DIGITAL CONVERTER USING TIMED LEVEL CHANGES

This invention relates to analog to digital (A-D) converters.

Various types of A-D converters are known in which an analog signal to be converted is periodically sampled at a predetermined rate which is typically twice the highest frequency of the analog signal. Each sampled value is converted into a corresponding digital signal, possibly in accordance with a desired companding law. Alternatively, only changes in the magnitude of the analog signal are recorded as digital signals.

Such known A-D converters use a constant sampling rate. To convert analog signals having high frequency components, a higher sampling rate must be used. This results in an increased amount of digital information per unit time, requiring greater storage or transmission capacity for storage or transmission of the information. The necessarily high sampling rate results in a large amount of redundant digital information, and hence wasted storage or transmission facilities, for portions of the analog signals which have a relatively low frequency and for which a much lower sampling rate would suffice.

Accordingly, in such known A-D converters the selected sampling rate is a compromise between the requirements of converting high frequency signal components and reducing the amount of digital information to be handled. If the highest frequency component of an analog signal to be converted is not known, it is difficult to select an appropriate sampling rate. Furthermore, if an analog signal to be converted includes both very high and very low (or zero) frequency portions, this compromise is not acceptable because it results in loss of high frequency signal components and/or production of an excessive amount of digital information.

The present invention, therefore, seeks to provide an A-D converter which is particularly suitable for converting analog signals which include both relatively high and relatively low frequency portions. The invention is not, however, limited to the conversion of such signals, but can equally be applied to converting any form of analog signal.

It is observed that this invention has arisen from a desire to record the waveforms of current surges which occur on telephone lines during lightning storms and from power system faults; current surges may arise from lightning striking the lines directly, or striking nearby power lines, or producing local changes in ground potential. While such current surges have generally been presumed to rise rapidly from zero to a peak and then to fall more slowly back to zero, a more detailed knowledge of the waveforms of the surges is desirable for example in order to enable design of improved protective devices. A waveform recorder constructed incorporating an embodiment of this invention described hereinafter has enabled waveforms of such current surges to be recorded without excessive loss of high frequency components and without production of large quantities of redundant information, either or both of which would occur using conventional A-D converters.

In accordance with an embodiment of this invention, an analog signal to be converted is not sampled periodically at a constant rate, but is sampled each time that a digital word representing a point of the signal is produced. Whenever the analog signal itself, or the difference between the analog signal and its last preceding sample, crosses various predetermined levels, this is detected and a digital code, representing the particular level which has been crossed, is produced. A priority encoder prevents more than one code, or an incorrect code, being produced at any instant. The digital code forms a part of a digital word, the remainder of which is constituted by a timing counter count which represents the time which has elapsed since the preceding sample occurred. With the production of the digital word the timing counter is reset and the analog signal is sampled again. In the event that the analog signal has a substantially constant level, the timing counter can reach its maximum count before another level crossing occurs. In this event a further digital word is produced, and the timing counter is reset and the analog signal is again sampled. This further digital word comprises either only a digital code representing that the timing counter has reached its maximum count, or this code together with the count of the counter.

Thus according to this invention there is provided an analog to digital converter comprising: sampling means for sampling an analog signal in response to a sample command; timing means for providing a digital representation of elapsed time following the last preceding sample command; means, responsive to the analog signal, and responsive to the difference between the analog signal and the last preceding sample thereof, crossing respective predetermined levels, for producing respective digital signals each comprising a code representing the particular level crossing and the digital representation of the elapsed time at which this level crossing occurred; means responsive to elapse of a predetermined period following the last preceding sample command, for producing a further digital signal comprising a code representing the elapse of said period; and control means for supplying a sample command to the sampling means, and for resetting the timing means, on the production of any of the digital signals; whereby said digital signals constitute a digital representation of said analog signal.

A preferred form of analog to digital converter according to this invention comprises:

a sampling circuit responsive to a sample command being supplied thereto to sample an analog input signal; a subtracting circuit arranged to subtract the last preceding sample of the analog input signal from the analog input signal to produce a difference signal; means including a plurality of first comparators each arranged to compare the analog input signal with a respective predetermined level for producing signals on respective ones of first lines in response to the analog input signal crossing said respective predetermined levels; means including a plurality of second comparators each arranged to compare the difference signal with a respective predetermined level for producing signals on respective ones of second lines in response to the difference signal crossing said respective predetermined levels; a source of clock pulses; a counter for counting said clock pulses; means for producing a signal on a third line in response to the counter reaching a predetermined count; means for detecting said signal(s) on any of said first, second, and third lines and for producing a digital code in dependence upon said signal(s); and control means responsive to detection of said signal(s) by said detecting means to supply a sample command to the sampling circuit, to cause the count of the counter and said digital code to be supplied as a digital representation of the analog input signal, and to reset the counter.

Preferably the means including the plurality of second comparators includes means for preventing production of said signals on at least one of said second lines except when the analog input signal lies within a predetermined range. This enables different voltage changes, or difference signal levels, to be recorded in different ranges of the input signal, providing for companding which may be desirable for the same reasons as in conventional analog to digital converters.

Signals may occur on more than one of the first, second, and third lines in any clock period; for example a difference signal level crossing may occur at the same instant that the analog signal crosses one of the levels with which it is compared. In order that in such a case only the most important information is recorded, the means for detecting the signal(s) and for producing the digital code can comprise a priority encoder for producing said digital code in accordance with priorities assigned to the respective ones of said first, second, and third lines.

The digital representations are preferably entered into a memory before being otherwise stored or transmitted. In order to enable detection of errors in subsequently processing information produced by the converter, it is possible also to incorporate test words periodically in the digital representations. This is particularly desirable if the digital representations are transferred serially bit-by-bit from the memory onto a digital recording tape, which may be subject to defects.

The invention also extends to a method of converting an analog signal into a digital representation thereof; comprising the steps of:

comparing the analog signal with at least one reference level; sampling the analog signal in response to a sample command; comparing the difference between the analog signal and the last preceding sample thereof with at least one reference level;

determining the elapsed time following the last preceding sample command; in response to one or more of the results of the comparisons indicating that a reference level has been crossed by the analog signal or said difference, producing a digital signal representative of said level crossing(s) and the elapsed time, and producing said sample command; and in response to said elapsed time reaching a predetermined period, producing a digital signal representative of this and producing said sample command; said digital signals constituting said digital representation of the analog signal.

Figure 2:
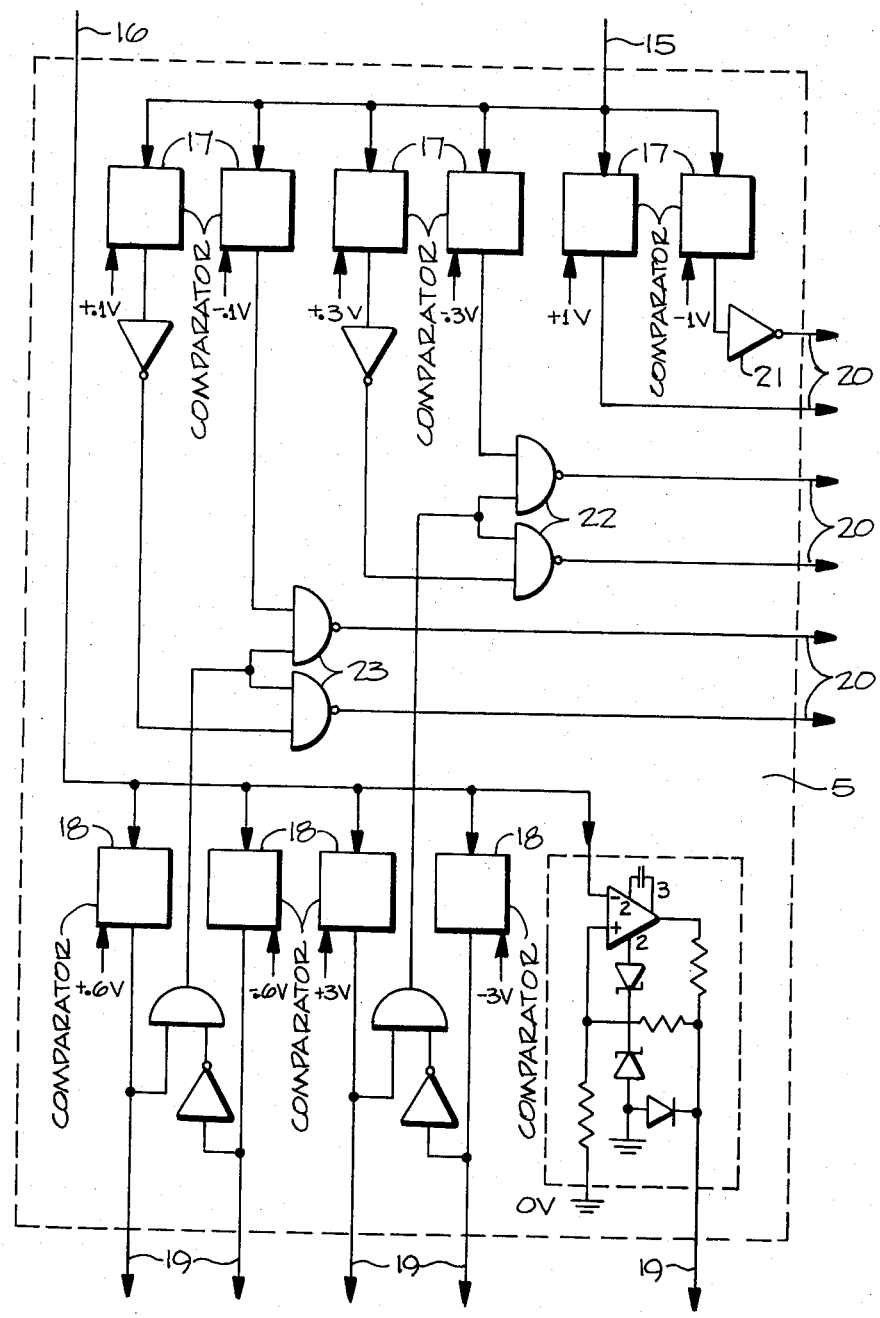
Figure 3:
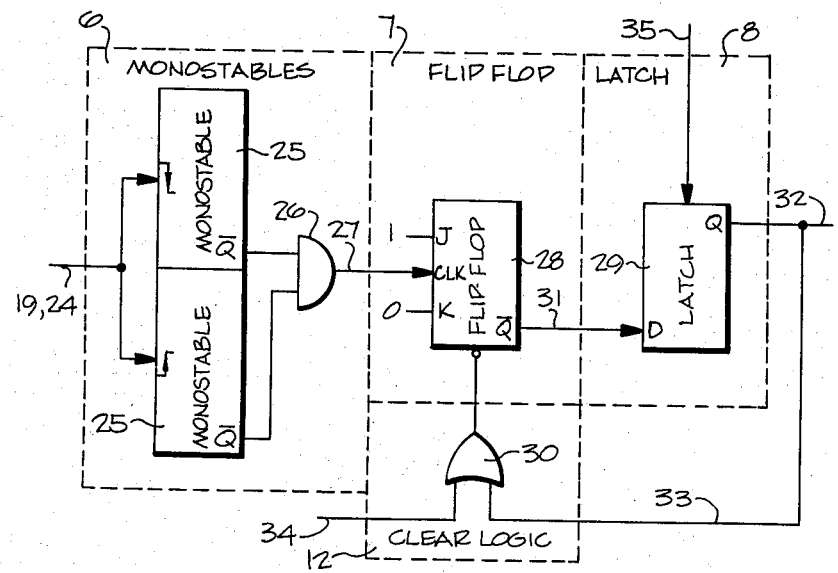
Figure 4:
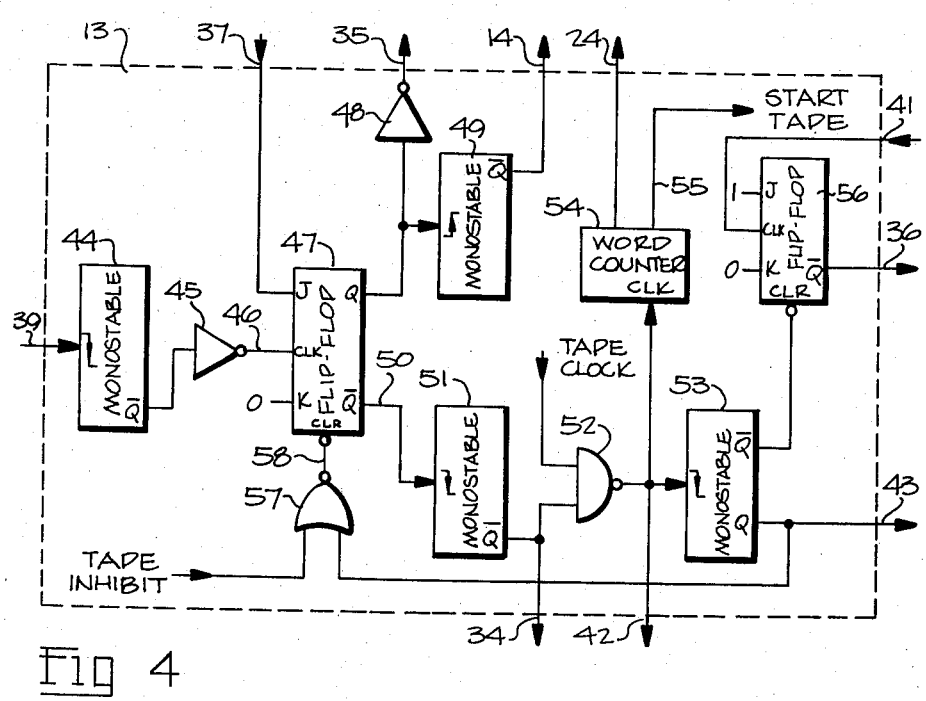

The invention will be further understood from the following description with reference to the accompanying drawings, in which:

FIG. 1 illustrates a block diagram of a signal waveform recorder including an A-D converter according to a preferred embodiment of the invention;

FIGS. 2, 3, and 4 illustrate in detail parts of the recorder of FIG. 1; and

Figure 5:
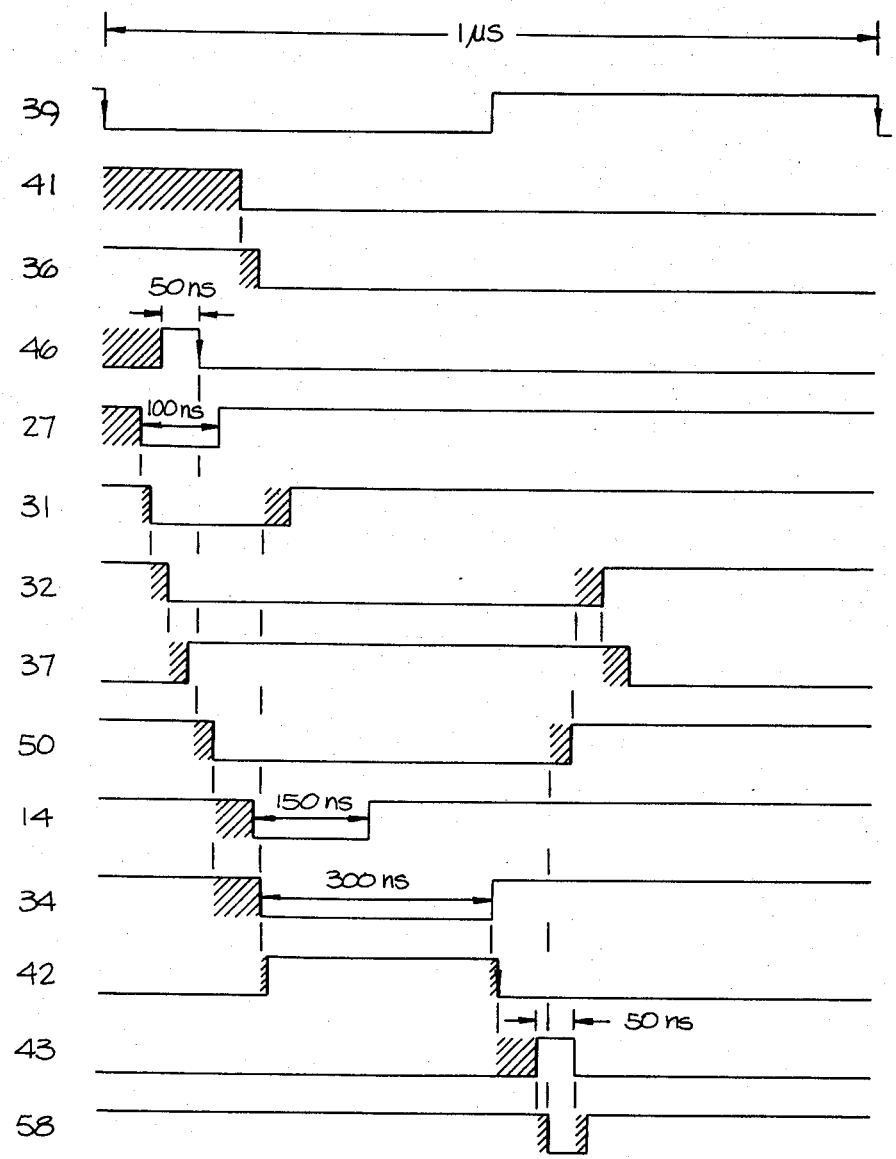

FIG. 5 illustrates signals which occur in operation of the recorder.

The signal waveform recorder shown in FIG. 1 serves to record digitally in a shift register memory 1 the waveform of an analog signal applied to an input 2 of the recorder. The waveform is recorded in the form of 1024 digital words each of 16 bits. Each word represents a respective point of the waveform, and consists of a 4-bit event code and a 12-bit time code, these codes being further explained below.

The recorder includes a sample-and-hold circuit 3, a difference amplifier 4, detector circuits 5, monostables 6, flip-flops 7, latches 8, and a priority encoder 9 which produces each 4-bit event code. The time code is produced by counting pulses of a 1 MHz clock 10 in a time counter 11. Clear logic 12 serves for resetting the flip-flops 7, and the operation of the recorder is controlled by a control unit 13.

The control unit 13 supplies sample commands to the sample-and-hold circuit 3 via a line 14. In response to each sample command, the circuit 3 samples the signal supplied from the input 2 to its input, and supplies the sampled value via its output to the inverting input of the difference amplifier 4. The signal at the input 2 is also supplied directly to the non-inverting input of the difference amplifier 4, which has unity gain. Consequently the difference amplifier 4 supplies to the detector circuits 5 via an output line 15 a signal which is equal to the difference between the instantaneous value of the input signal and the last preceding sampled value thereof. The input signal is also supplied via a line 16 directly to the detector circuits 5.

The detector circuits 5 are shown in detail in FIG. 2, and basically consist of comparators 17 and 18, all of which are similar to one another and accordingly only one of which is shown in detail. As shown in FIG. 2, each comparator consists of a differential amplifier, type LH0032, to the inverting input of which one of the lines 15 and 16 is connected, to the non-inverting input of which a respective reference potential is coupled, and an output of which is coupled to an output of the comparator. Each comparator also includes circuitry to limit the output voltage swing to TTL levels.

In the comparators 18, the signal supplied to the input 2 and present on the line 16 is compared with predetermined levels of +3 volts, −0.6 volts, 0 volts, +0.6 volts, and +3 volts. The outputs of the former 3 comparators are normally high, and go low if the input signal level exceeds (i.e. is more positive than) +3 volts, +0.6 volts, and 0 volts respectively. The outputs of the latter 2 comparators are normally low, and go high if the input signal falls below (i.e. is more negative than) −0.6 volts and −3 volts respectively. The outputs of the comparators 18 are connected to output lines 19 of the detector circuits 5.

In the comparators 17, the difference signal supplied via the line 15 is compared with predetermined levels of +0.1 volts, −0.1 volts, +0.3 volts, −0.3 volts, +1 volt, and −1 volt. The outputs of the comparators 17 are coupled to outputs 20 of the detector circuits 5, which outputs are normally high. The output of the +1 volt comparator 17 is connected directly, and the output of the −1 volt comparator 17 is connected via an inverter 21, to the respective outputs 20 which accordingly go low if the difference signal on the line 15 exceeds +1 volt or falls below −1 volt respectively. The outputs of the +0.3 volts and −0.3 volts comparators 17 are coupled to the respective outputs 20 via NAND gates 22 which are controlled in dependence upon the outputs of the +3 volts and −3 volts comparators 18. Only if the difference signal on the line 15 exceeds +0.3 volts or falls below −0.3 volts, and the input signal on the line 16 lies between −3 and +3 volts, does the output of one of the NAND gates 22 go low. Similarly, the outputs of the ±0.1 volt comparators 17 are coupled to the respective outputs 20 via NAND gates 23 controlled by the outputs of the ±0.6 volt comparators 18, so that only if the difference signal on the line 15 exceeds +0.1 volt or falls below −0.1 volt, and the input signal on the line 16 lies between −0.6 and +0.6 volts, does the output of one of the NAND gates 23 go low.

The outputs 19 of the detector circuits 5, and a line 24 from the control unit 13, are each connected via the monostables 6 and flip-flops 7 to the latches 8. FIG. 3 illustrates circuitry provided individually for each of the lines 19 and 24. As shown in FIG. 3, the monostables 6 comprise 2 monostable circuits 25 and an AND gate 26 for each line 19 or 24. The line is connected to trigger inputs of the monostable circuits 25, one of which is triggered on the rising edge and the other on the falling edge of level changes on the line 19 or 24. The $\overline{Q}$ outputs of the circuits 25 are connected to inputs of the AND gate 26. Each monostable circuit 25 produces a 100 ns pulse when it is triggered. Consequently, for each level change (from high to low or from low to high) on the line 19 or 24 a 100 ns pulse is produced on a respective output line 27 of the monostables 6.

The flip-flops 7 comprise a JK flip-flop 28, the latches 7 comprise a latch 29, and the clear logic 12 comprises an OR gate 30, for each of the lines 27, as shown in FIG. 3. Each line 27 is connected to the clock input Clk of the flip-flop 28, which is triggered on the falling edge of the signal supplied to its clock input. The $\overline{Q}$ output of the flip-flop 28 is connected via a line 31 to the data input D of the latch 29, whose Q output is connected via a line 32 to a respective input of the priority encoder 9 and via a line 33 to one input of the OR gate 30. The other input of the OR gate 30 is connected to a line 34 from the control unit 13, and the output of the OR gate 30 is connected to a reset input of the flip-flop 28. A line 35 from the control unit 13 is connected to a latch enable input of the latch 29. The monostable circuits 25, JK flip-flops 28, and latches 29 are constituted by type 74123, 74103, and 7475 devices respectively.

The outputs 20 of the detector circuits 5, and a line 36 from the control unit 13, are each connected to the D input of a respective latch 29 in the same manner as each line 31. The Q outputs of these latches are similarly connected via lines 32' to respective inputs of the priority encoder 9.

It will be noted that a double stage of latching is provided for signals on the lines 19 and 24 by the flip-flops 28 and the latches 29. The flip-flops 28 ensure that events, such as transitions of the input signal through the various reference levels supplied to the comparators 18, are recorded even though they may occur at high speed with a duration much less than one clock period. The latches 29 ensure that the inputs of the priority encoder 9 do not change, and hence the outputs of the priority encoder 9 do not change, during the entry of information of the memory 1, and thus prevent events which may occur during this entry of information from affecting the information entered. These events are taken into account in the next following clock period. The double stage of latching also enables a flip-flop 28 which has been set, and whose information has been latched in the relevant latch 29, to be quickly cleared and hence re-enabled well before completion of the priority encoding and entry of information into the memory 1; this early clearing also ensures that events which occur are not erroneously recorded in the memory 1 more than once.

From the foregoing description it should be appreciated that signals on the lines 19 are associated with transitions of the input signal through levels of 0, ±0.6, and ±3 volts, and signals on lines 20 are associated with changes of the input signal, from the preceding sample, of ±0.1, ±0.3, and ±1 volt. A signal from the control unit 13 on the line 24 is associated with a test word, and a signal from the control unit 13 on the line 36 is associated with what is termed herein as a d.c. level of the input signal. On the occurrence of any of these signals associated with their respective events, a low level is produced on the respective one or more of the lines 32 and 32'. On occurrence of such a low level the priority encoder 9 supplies a signal to the control unit 13 via a line 37, and produces on output lines 38 the 4-bit event code which corresponds to the highest priority of the low level signals which it has received via the lines 32 and 32'. The priority encoder 9, which comprises two type 74148 devices and associated gating circuitry, accords the various events the following order of priority:

| Test Word | Highest Priority |
|---|---|
| D.C. Level | |
| 0 volt transition | |
| −3 volt transition | |
| +3 volt transition | |
| −1 volt change | |
| +1 volt change | |
| −0.6 volt transition | |
| +0.6 volt transition | |
| −0.3 volt change | |
| +0.3 volt change | |
| −0.1 volt change | |
| +0.1 volt change | Lowest Priority |

As already described, the time counter 11 counts pulses of the clock 10, which pulses are also supplied via a line 39 to the control unit 13. The time counter 11 has a counting capacity of $2^{12}=4096$, and has 12 counter stage outputs connected via 12 lines 40 to the memory 1. The most significant of these outputs is connected via a line 41 to the control unit 13 to indicate when the counter 11 reaches its maximum count and to instigate production of a signal on the line 36, indicating a d.c. level of the input signal at the input 2.

The control unit 13, as described more fully below, is responsive to a signal on the line 37 to produce a pulse on a line 42 which is connected to a shift pulse input of the shift register memory 1, which consists of 16 1024-bit shift registers the inputs of which are connected to the lines 38 and 40. The control unit 13 also produces on a line 43 a pulse which resets the time counter 11.

Referring to FIG. 4, the control unit 13 comprises a falling-edge-triggered monostable circuit 44 to the trigger input of which the line 39 is connected and the $\overline{Q}$ output of which is connected via an inverter 45 to a line 46. The line 46 is connected to the clock input Clk, and the line 37 is connected to the J input, of a JK flip-flop 47. The Q output of the flip-flop 47 is connected via an inverter 48 to the line 35, and directly to the trigger input of a rising-edge-triggered monostable circuit 49 whose $\overline{Q}$ output is connected to the line 14. The $\overline{Q}$ output of the flip-flop 47 is connected via a line 50 to the trigger input of a falling-edge-triggered monostable circuit 51 whose $\overline{Q}$ output is connected to the line 34 and to one input of a NAND gate 52. A second input of the gate 52 is supplied with a signal "Tape Clock" which is normally high. The output of the gate 52 is connected to the line 42, to the trigger input of a falling-edge-triggered monostable circuit 53, and to the clock input Clk of a word counter 54. The output of the seventh stage of the counter 54, which output changes state every 64th word counted by the counter, is connected to the line 24, and the counter 54 supplies a signal "Start Tape" on a line 55 when it reaches a count of 1024. The line 41 is connected to the clock input Clk of a JK flip-flop 56 whose $\overline{Q}$ output is connected to the line 36. The $\overline{Q}$ output of the monostable circuit 53 is connected to a clear input Clr of the flip-flop 56, and the Q output of the circuit 53 is connected to the line 43 and to one input of a NOR gate 57. A second input of the gate 57 is supplied with a normally low signal "Tape Inhibit", and its output is connected via a line 58 to a clear input of the flip-flop 47. The monostable circuits 44, 49, 51 and 53 are type 74121 devices, the JK flip-flops 47 and 56 are formed by a type 7473 device, and the word counter 54 is formed by three type 7493 devices.

The operation of the waveform recorder is described below with reference to FIG. 5 which illustrates signals which can occur during one cycle of the clock 10. In FIG. 5 the various signals are given the same references as the lines on which they appear. The signals shown in FIG. 5 are produced assuming that the various devices of the recorder have typical propagation times, which are shown hatched. As can be seen, these propagation times occupy a significant part of the clock period, and so can not be ignored. The system was designed to operate regardless of any combination of propagation times of the particular device types used.

On the falling edge of the clock on line 39, the time counter 11 is incremented and the monostable circuit 44 is triggered to produce a pulse of 50 ns duration which appears on the line 46. A change in the level of any of the lines 19 occurring at the same instant as the falling edge of the clock triggers the associated one of the monostables 6 to produce a pulse of 100 ns duration on the associated line 27. If a similar change occurs earlier in relation to the clock signal, it is recorded in the same manner as described below. If a similar change occurs later in relation to the clock signal, it may still be recorded as described below depending on the propagation times of the devices, but otherwise it is recorded during the next following clock period.

The falling edge of the 100 ns pulse on the line 27 sets the associated flip-flop 28 so that the line 31 goes low. This information is transferred through the respective open latch 29 so that the respective line 32 also goes low. The priority encoder 9 detects that at least one of its inputs has gone low, and it consequently supplies a high level on its output line 37. This high level is also produced in the event of a level change on the line 24, or a low level on any of the lines 20 and 36.

The falling edge at the end of the 50 ns pulse on the line 46 sets the flip-flop 47 in accordance with the high level on the line 37 (assuming that the "Tape Inhibit" signal has its normally low level). Consequently the line 50 goes low as shown in FIG. 5. The line 35 carries a similar signal to that on the line 50, but slightly delayed in relation thereto. The low level produced on the line 35 closes the latches 8 so that the information then present at the latch inputs is held at the latch outputs. The rising edge at the Q output of the flip-flop 47 triggers the monostable circuit 49 to produce a pulse of 150 ns duration on the line 14. This pulse constitutes a sample command and causes the sample-and-hold circuit 3 to sample and hold the instantaneous value of the input signal.

The falling edge of the signal on the line 50 triggers the monostable circuit 51 to produce a pulse of 300 ns duration on the line 34. This pulse is gated, in the clear logic 12, with the outputs of the latches 8 on the lines 32 in order to clear any flip-flops 28 which have been set and whose information has been latched by the relevant latch 29. If a flip-flop 28 has been set after the relevant latch 29 has been closed, it is not cleared in this clock period but remains set. Consequently, when the latches 29 are re-opened the information constituted by this set flip-flop 28 is presented via the relevant latch 29 to the priority encoder 9 so that it is taken into account in the following clock period.

The 300 ns pulse at the $\overline{Q}$ output of the monostable circuit 51 is inverted by the normally enabled NAND gate 52 to produce a shift pulse on the line 42. On the falling edge of this shift pulse the information present on the lines 38 and 40 is shifted into the shift register memory 1. It should be noted that the 300 ns pulse not only allows ample time for the counter 11 outputs to stabilize, but also ensures that the priority encoder 9 has sufficient time to encode correctly the highest priority information supplied to its inputs, thereby avoiding entry of erroneous information into the memory 1.

The falling edge of the signal at the output of the gate 52 also increments the word counter 54 and triggers the monostable circuit 53 to produce a word pulse of 50 ns duration on the line 43, which pulse resets the time counter 11 to a count of zero. This pulse is also inverted by the normally enabled NOR gate 57 to produce on the line 58 a pulse which resets the flip-flop 47. Consequently the line 50 returns to a high level, as does the line 35 to re-open the latches 8. The relevant line 32 therefore returns to a high level, the associated flip-flop 28 having been reset, and if no further event has occurred the output of the priority encoder on the line 37 returns to a low level. Thus the various devices are reset to their original states.

The above sequence is repeated in subsequent clock periods for further events which occur, either in respect of the lines 19 and 24 with triggering of the monostables 6 and setting and resetting of the flip-flops 7, or in respect of the lines 20 and 36. If no event has occurred so that the line 37 remains at a low level, then the flip-flop 47 is not set and only the time counter 11 is incremented.

If the input signal at the input 2 is substantially constant, then the time counter 11 is successively incremented until it reaches its maximum count. At the start of the next clock period the time counter 11 is again incremented (from its maximum count to zero) so that a high-to-low transition is produced on the line 41 as shown in FIG. 5. This falling edge sets the flip-flop 56 so that a low level is produced at its Q output and on the line 36, and hence also on the relevant lines 31 and 32 so that a high level is produced on the line 37. This high level occurs after the occurrence of the falling edge on the line 46 so that the flip-flop 47 is not set in this clock period. In the following clock period, because the line 37 carries a high level, the falling edge on the line 46 sets the flip-flop 47 so that the latches 8 are closed and the low level on the line 36 is latched in the same manner as described above and the encoder 9 produces an event code representing a d.c. level. This event code is shifted into the memory 1 with the prevailing time count of 1 (although this time count is obviously redundant information), and the flip-flop 56 is subsequently cleared when the $\overline{Q}$ output of the monostable circuit 53 goes low.

The word counter 54 counts the shift pulses supplied to the memory 1, and emits the "Start Tape" signal on the line 55 when a count of 1024 is reached, i.e. when the memory 1 is full. The "Start Tape" signal initiates a transfer of the information contained in the memory 1 onto a digital recording tape on which the bits and words are recorded serially. To this end the "Tape Inhibit" signal goes high to hold the flip-flop 47 in its cleared or reset state, so that no further information can be entered into the memory 1, and the "Tape Clock" signal alternates between high and low levels to provide shift pulses via the gate 52 and the line 42 to the memory 1, thereby shifting information word-by-word from the memory 1 to a parallel-to-serial converter and thence to the tape. As the entry of the information onto the tape is known in itself, no further description of this is necessary here.

The information recorded on the tape can be processed or utilized in any desired manner, for example to plot the recorded waveforms on a graphic display device. As a result of the serial recording of bits on the tape, a single bit defect on the tape can cause a lack of synchronization between the information recorded and that processed, leading to errors. In order to enable detection of such errors, a test word is produced and recorded every 64 words. To this end, every 64 words, or shift pulses, the word counter 54 produces a level change on the line 24. This level change triggers the associated one of the monostables 6 to set the respective flip-flop 7. Consequently, in the clock period immediately following one in which an event occurs, resulting in a shift pulse which produces a level change on the line 24, a digital test word is recorded in the memory 1 which test word comprises a respective event code and a time count of one. The presence of such test words, every 64th word on the tape which is eventually produced, can be checked to ensure that the recorded information is correctly processed. Furthermore, the presence of the test word in the recorded data provides a continuous check on the correct functioning of the recorder. Thus it serves as a check on the counting by the word counter, the operation of the control unit and the counting and clearing of the timing counter in that the time count of the test word should be one, the encoding by the priority encoder, and the loading of information to the memory and transfer to the tape. In the event that an error does occur the presence of the test words enables the information on the tape to be re-synchronized and enables valid information to be determined and used.

In an embodiment of the invention as described above and constructed for recording current surges on telephone lines produced as a result of lightning, or power system faults, a line to be monitored was coupled via an input attenuator and protective device which also provided current to voltage conversion, then via a 20 millisecond delay line having a high-frequency response, and then via a 500 kHz low pass filter, to the input 2 of the recorder. A threshold detector was coupled to the input attenuator and protective device to detect the initial part of a current surge due to lightning, and upon such detection set a latch to provide power to the waveform recorder. The delay line provided a sufficient delay to enable the recorder to be switched on for recording the whole of the current surge waveform. The 500 kHz cut-off frequency of the low pass filter, which had a very gradual roll-off above this frequency, was selected to be half the frequency of the 1 MHz clock 10.

After recordal of 1024 digital words in the memory 1 as described above, a transfer to a digital recording tape was initiated as also described above, and after this transfer the power supply to the recorder was automatically switched off until detection of a subsequent current surge. Thus between consecutively recorded current surges only a relatively low power consumption trigger detector remained switched on.

Whilst a preferred embodiment of the invention has been described above, it is obvious that this may be modified, varied, and adapted in many different ways without departure from the scope of the invention as defined in the claims. For example faster logic devices could be utilized in order to simplify the control unit and/or to enable recordal of higher-frequency waveforms. The lines 20 could be coupled to the latches 8 via flip-flops arranged in the same manner as the flip-flips 7, and different arrangements could be provided for setting the flip-flops 7 to obviate the need for the monostables 6. In different applications the flip-flops 7 themselves could conceivably be dispensed with. Obviously, other reference voltages and voltage ranges could be employed in the detector circuits 5. In addition, the information supplied to or recorded in the memory could be utilized differently; for example it could be transmitted over a data or telephone link rather than being stored on tape. In the latter respect it should be appreciated that the A-D converter of the invention can be used not only in a waveform recorder as described, but also in any other application in which A-D converters are conventionally used.

It is furthermore observed that the digital information which is produced by the A-D converter of this invention can be further compressed to reduce the total amount of digital information which must be stored or transmitted. It has already been noted that the time counter count is redundant information in the case where the event code represents a d.c. level of the analog input signal. In this case, therefore, the time code need not be stored or transmitted. When the analog input signal has reached a d.c. level, it is quite likely that it will remain a d.c. level for some time, so that a plurality of event codes each representing the d.c. level will be produced consecutively by the converter. This information can be compressed by storing or transmitting, for example, only a single event code representing the d.c. level together with a signal representing the number of times which this event code is repeated before some other event code occurs.

What is claimed is:
1. An analog to digital converter comprising:
 sampling means for sampling an analog signal in response to a sample command;
 timing means for providing a digital representation of elapsed time following the last preceding sample command;
 means, responsive to the analog signal, and responsive to the difference between the analog signal and the last preceding sample thereof, crossing respective predetermined levels, for producing respective digital signals each comprising a code representing the particular level crossing and the digital representation of the elapsed time at which this level crossing occurred;
 means, responsive to elapse of a predetermined period following the last preceding sample command, for producing a further digital signal comprising a code representing the elapse of said period; and control means for supplying a sample command to the sampling means, and for resetting the timing means, on the production of any of the digital signals;

whereby said digital signals constitute a digital representation of said analog signal.

2. A converter as claimed in claim 1 wherein the means, responsive to the analog signal and said difference, comprises a plurality of first comparators each arranged to compare the analog signal with a respective predetermined level, means for subtracting the last preceding sample of the analog signal from the analog signal to produce a difference signal, and a plurality of second comparators each arranged to compare the difference signal with a respective predetermined level.

3. A converter as claimed in claim 2 and including means for inhibiting output signals produced by selected ones of said second comparators in dependence upon output signals produced by selected ones of said first comparators.

4. A converter as claimed in claim 2 or 3 wherein the means, responsive to the analog signal and said difference, further comprises a plurality of bistable stages each arranged to be changed in state in response to an output signal from a respective one of the comparators changing in response to occurrence of the respective level crossing, and means responsive to a change in state of any of said bistable stages for latching information relating to the states of said bistable stages, producing a respective digital signal in dependence upon the latched information, resetting those bistable stages whose state has been changed and whose information has been latched, and causing the control means to supply said sample command and reset the timing means.

5. A converter as claimed in claim 4 wherein the means responsive to said change for producing a respective digital signal comprises a priority encoder for producing the code in said digital signal in accordance with priorities associated with the respective level crossings.

6. An analog to digital converter comprising:
a sampling circuit responsive to a sample command being supplied thereto to sample an analog input signal;
a subtracting circuit arranged to subtract the last preceding sample of the analog input signal from the analog input signal to produce a difference signal;
means including a plurality of first comparators each arranged to compare the analog input signal with a respective predetermined level for producing signals on respective ones of first lines in response to the analog input signal crossing said respective predetermined levels;
means including a plurality of second comparators each arranged to compare the difference signal with a respective predetermined level for producing signals on respective ones of second lines in response to the difference signal crossing said respective predetermined levels;
a source of clock pulses;
a counter for counting said clock pulses;
means for producing a signal on a third line in response to the counter reaching a predetermined count;
means for detecting said signal(s) on any of said first, second, and third lines and for producing a digital code in dependence upon said signal(s); and
control means responsive to detection of said signal(s) by said detecting means to supply a sample command to the sampling circuit, to cause the count of the counter and said digital code to be supplied as a digital representation of the analog input signal, and to reset the counter.

7. A converter as claimed in claim 6 wherein the means including the plurality of second comparators includes means for preventing production of said signals on at least one of said second lines except when the analog input signal lies within a predetermined range.

8. A converter as claimed in claim 6 wherein said means for producing said signals on said first, second, and third lines comprise a latch in respect of each line, the latches all being closed simultaneously to hold said signal(s) at their outputs in response to detection of said signal(s) by said detecting means, and being opened after the supply of said digital representation.

9. A converter as claimed in claim 6 wherein the means for detecting said signal(s) and for producing said digital code comprises a priority encoder for producing said digital code in accordance with priorities assigned to the respective ones of said first, second, and third lines.

10. A converter as claimed in claim 6 and including a memory arranged to be supplied with each said digital representation, the control means being responsive to detection of said signal(s) by said detecting means to supply a signal to enter the count of the counter and the digital code constituting each digital representation into the memory.

11. A converter as claimed in claim 6 or 10 wherein the control means includes means for counting the number of digital representations of the analog input signal which have been produced, and for producing a signal on the fourth line at predetermined counts of said counting means, a signal on said fourth line being processed in the same manner as signal(s) on said first, second, and third lines to produce a digital representation comprising a digital code which represents said signal on said fourth line and can serve for detecting errors on processing digital information produced by the converter.

12. A converter as claimed in claim 7 wherein said predetermined range extends between two of the predetermined levels with which the first comparators compare the analog input signal, said means for preventing production of said signal being responsive to output signals of the associated two of the first comparators.

13. A converter as claimed in claim 8 wherein at least one of said means for producing said signals on said first, second, and third lines comprises a bistable stage in respect of each line, each bistable stage being arranged to be set to produce said signal on the respective line, and means for resetting each bistable stage which has been set to produce the associated signal and which signal has been latched and held at the respective output of the latches.

14. A method of converting an analog signal into a digital representation thereof, comprising the steps of:
comparing the analog signal with at least one reference level;
sampling the analog signal in response to a sample command;
comparing the difference between the analog signal and the last preceding sample thereof with at least one reference level;
determining the elapsed time following the last preceding sample command;

in response to one or more of the results of the comparisons indicating that a reference level has been crossed by the analog signal or said difference, producing a digital signal representative of said level crossing(s) and the elapsed time, and producing said sample command; and in response to said elapsed time reaching a predetermined period, producing a digital signal representative of this and producing said sample command;

said digital signals constituting said digital representation of the analog signal.

* * * * *